United States Patent
Ishida et al.

(10) Patent No.: US 9,568,614 B2
(45) Date of Patent: Feb. 14, 2017

(54) RADIATION DETECTION APPARATUS, METHOD OF MANUFACTURING THE SAME, AND IMAGING SYSTEM

(71) Applicant: CANON KABUSHIKI KAISHA, Tokyo (JP)

(72) Inventors: Yohei Ishida, Honjo (JP); Satoshi Okada, Tokyo (JP); Kazumi Nagano, Honjo (JP); Shoshiro Saruta, Kodama (JP); Keiichi Nomura, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 374 days.

(21) Appl. No.: 13/895,537

(22) Filed: May 16, 2013

(65) Prior Publication Data
US 2013/0341516 A1   Dec. 26, 2013

(30) Foreign Application Priority Data

Jun. 20, 2012  (JP) ................................ 2012-139161

(51) Int. Cl.
*G01T 1/161* (2006.01)
*G01T 1/20* (2006.01)
(Continued)

(52) U.S. Cl.
CPC ........... *G01T 1/2006* (2013.01); *G01T 1/2018* (2013.01); *H01L 31/02322* (2013.01); *H01L 31/115* (2013.01); *H01L 31/18* (2013.01)

(58) Field of Classification Search
CPC ...... G01T 1/1642; G01T 1/2985; G01T 1/161; G01T 1/1648; G01T 1/2018
See application file for complete search history.

(56) References Cited

U.S. PATENT DOCUMENTS 6,278,118 B1 * 8/2001 Homme et al. ........ G01T 1/2018
                                                           250/367
6,608,312 B1 * 8/2003 Okada et al. ............ 250/370.11
(Continued)

FOREIGN PATENT DOCUMENTS

CN            102110698          6/2011
CN            102193104          9/2011
(Continued)

OTHER PUBLICATIONS

Office Action issued Jun. 3, 2015 in counterpart P.R. China patent application 201310237615.1, with translation.
(Continued)

*Primary Examiner* — David Porta
*Assistant Examiner* — Mamadou Faye
(74) *Attorney, Agent, or Firm* — Fitzpatrick, Cella, Harper & Scinto (57) ABSTRACT

A radiation detection apparatus comprises a sensor panel including a plurality of sensor units which detect radiation and are arrayed, each of the plurality of sensor units comprising a pixel array including a plurality of pixels which detect light and are two-dimensionally arranged, a scintillator layer which converts radiation into light, and a first scintillator protective layer disposed to cover the scintillator layer, and the radiation detection apparatus further comprising a second scintillator protective layer disposed to cover the plurality of sensor units.

16 Claims, 11 Drawing Sheets (51) Int. Cl.
*H01L 31/18* (2006.01)
*H01L 31/0232* (2014.01)
*H01L 31/115* (2006.01)

(56) References Cited

U.S. PATENT DOCUMENTS

| | | | |
|---|---|---|---|
| 7,019,301 B2 | 3/2006 | Homme et al. | 250/370.11 |
| 7,019,302 B2* | 3/2006 | Takabayashi et al. | G01T 1/2018 250/370.11 |
| 7,315,027 B2 | 1/2008 | Okada et al. | 250/370.11 |
| 7,391,029 B2 | 6/2008 | Takeda et al. | 250/370.11 |
| 8,704,185 B2* | 4/2014 | Ishida et al. | G01T 1/20 250/361 R |
| 2002/0121606 A1* | 9/2002 | Okada et al. | G01T 1/2018 250/370.11 |
| 2004/0089813 A1* | 5/2004 | Takabayashi et al. | G01T 1/2018 250/370.11 |
| 2008/0083877 A1* | 4/2008 | Nomura et al. | 250/370.11 |
| 2010/0276600 A1* | 11/2010 | Ronda et al. | G01T 1/2002 250/362 |
| 2010/0288935 A1* | 11/2010 | Majewski et al. | 250/363.03 |
| 2011/0155917 A1 | 6/2011 | Nomura et al. | 250/370.08 |
| 2011/0198505 A1 | 8/2011 | Ishida et al. | 250/363.01 |
| 2011/0291018 A1 | 12/2011 | Nagano et al. | 250/369 |
| 2011/0309258 A1 | 12/2011 | Ishida et al. | 250/369 |
| 2012/0193544 A1* | 8/2012 | Kaneko et al. | G01T 1/2018 250/369 |
| 2013/0026377 A1 | 1/2013 | Ichimura et al. | 250/367 |
| 2013/0153775 A1 | 6/2013 | Nomura et al. | 250/366 |
| 2013/0168559 A1 | 7/2013 | Saruta et al. | 250/366 |

FOREIGN PATENT DOCUMENTS

| | | |
|---|---|---|
| JP | 2002-048870 | 2/2002 |
| JP | 2005-203708 | 7/2005 |

OTHER PUBLICATIONS

Office Action issued Jan. 27, 2016 in counterpart P.R. China patent application 201310237615.1, with translation.

* cited by examiner

| | PITCH p [μm] | DISTANCE g [μm] | DISTANCE L [μm] | THICKNESS t1 [μm] | AMOUNT OF INFORMATION LOST [COLUMN] |
|---|---|---|---|---|---|
| COMPARATIVE EXAMPLE 1 | 50 | 50 | 100 | 25 | 1 |
| COMPARATIVE EXAMPLE 2 | 50 | 25 | 75 | 12.5 | 0.5 |
| EXAMPLE 1-1 | 50 | 12.5 | 62.5 | 6.25 | 0.25 |
| EXAMPLE 1-2 | 50 | 10 | 60 | 5 | 0.2 |
| EXAMPLE 1-3 | 50 | 5 | 55 | 2.5 | 0.1 |

RADIATION DETECTION APPARATUS, METHOD OF MANUFACTURING THE SAME, AND IMAGING SYSTEM

BACKGROUND OF THE INVENTION

Field of the Invention

The present invention relates to a radiation detection apparatus, a method of manufacturing the same, and an imaging system.

Description of the Related Art

Japanese Patent Laid-Open No. 2002-48870 discloses the structure of a radiation detection apparatus for a large screen in which a plurality of sensor panels are arranged. Each sensor panel includes a scintillator layer 3 formed on a light-receiving portion 22 (pixel portion) disposed on a substrate 20 and a protective film 4 (scintillator protective layer) formed to cover the scintillator layer 3. In this manner, in a radiation detection apparatus using a scintillator layer, it is necessary to cover the scintillator layer with a protective layer to prevent the deliquescence of the scintillator layer.

According to Japanese Patent Laid-Open No. 2002-48870, each of adjacent panels is fixed on its side surface via a UV curable resin. In the above structure, since no pixels can be arranged on the boundary between a sensor panel and its adjacent sensor panel, there are portions where no pixels exist. This leads to a noticeable problem unless the distances between the adjacent sensor panels decrease while the pixel size decreases with an increase in pixel density.

SUMMARY OF THE INVENTION

The present invention provides a technique effective in increasing the pixel density of a radiation detection apparatus for a large screen.

One of the aspects of the present invention provides a radiation detection apparatus comprising a sensor panel including a plurality of sensor units which detect radiation and are arrayed, each of the plurality of sensor units comprising a pixel array including a plurality of pixels which detect light and are two-dimensionally arranged, a scintillator layer which converts radiation into light, and a first scintillator protective layer disposed to cover the scintillator layer, and the radiation detection apparatus further comprising a second scintillator protective layer disposed to cover the plurality of sensor units.

Further features of the present invention will become apparent from the following description of exemplary embodiments with reference to the attached drawings.

DESCRIPTION OF THE EMBODIMENTS

First Embodiment

Figure 1A:
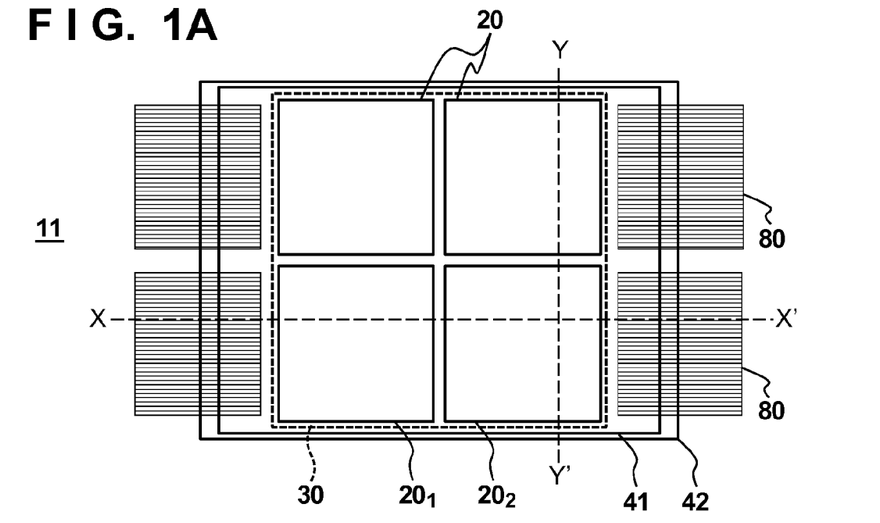
FIGS. 1A to 1C are views for explaining an example of the arrangement of the first embodiment.
Figure 1B:
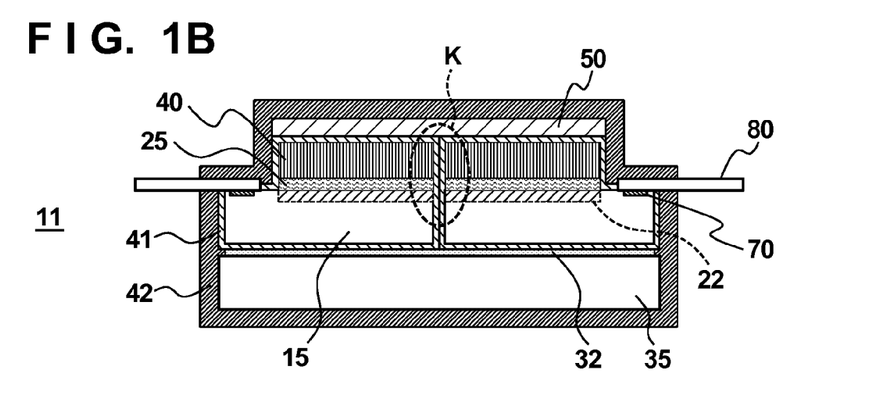
Figure 1C:
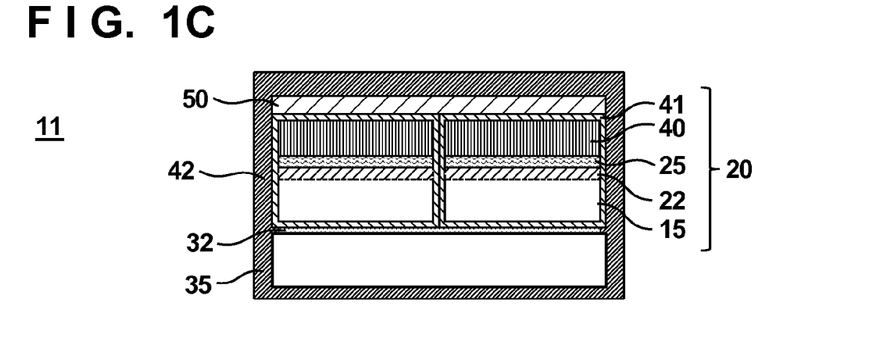

A radiation detection apparatus 11 of the first embodiment will be described with reference to FIGS. 1A to 5. FIGS. 1A to 1C schematically show the structure of the radiation detection apparatus 11. FIG. 1A is a schematic plan view of the radiation detection apparatus 11. FIG. 1B schematically shows a sectional structure of the radiation detection apparatus 11 taken along a cut line X-X' shown in FIG. 1A. FIG. 1C schematically shows a sectional structure of the radiation detection apparatus 11 taken along a cut line Y-Y'. The radiation detection apparatus 11 includes a sensor panel 30 in which a plurality of sensor units 20 for detecting radiation (including electromagnetic waves such as X-rays, α-rays, β-rays, and γ-rays) are arrayed. FIG. 1A shows the four sensor units 20. However, the number of sensor units 20 is not limited to four, and may be two or three or five or more. The plurality of sensor units 20 include, for example, a first sensor unit $20_1$ and a second sensor unit $20_2$, which are arranged adjacent to each other. The respective sensor units 20 can be arranged on a base 35 through an adhesion layer 32. The base 35 can support the respective sensor units 20 which are fixed with the adhesion layer 32.

Figure 2A:
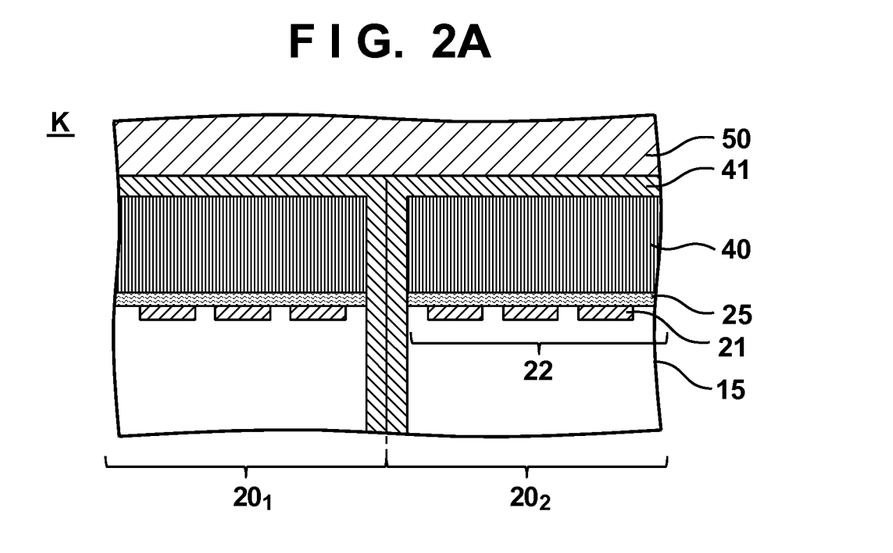
FIGS. 2A and 2B are enlarged views for explaining an example of the arrangement of the first embodiment.
Figure 2B:
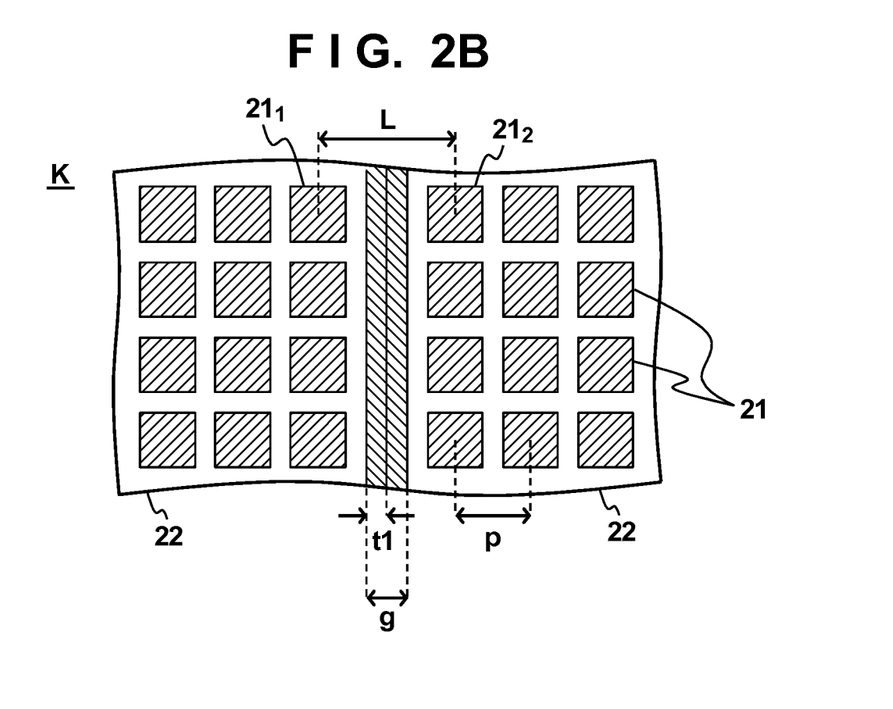

FIGS. 2A and 2B are enlarged views schematically showing a boundary region K between the first sensor unit $20_1$ and the second sensor unit $20_2$. FIG. 2A is a sectional view of the boundary region K. FIG. 2B is a plan view of the boundary region K.

Each sensor unit 20 includes a pixel array 22 having a plurality of pixels 21 for detecting light which are two-dimensionally arranged on a substrate 15, a scintillator layer 40 for converting radiation into light, and a first scintillator protective layer 41 disposed to cover the scintillator layer 40. The radiation detection apparatus 11 further includes a second scintillator protective layer 42 disposed to cover the plurality of sensor units 20. The radiation detection apparatus 11 includes a reflection layer 50 disposed between the sensor panel 30 and the second scintillator protective layer 42.

Each pixel 21 can include a sensor (for example, a PIN photodiode sensor or MIS sensor) as a photoelectric conversion element and a plurality of switching elements (TFTs or the like) for reading the electrical signal obtained by the sensor. The read signal can be output from a signal input/output unit 70 to an external signal processing circuit board (not shown) via interconnections 80 upon having undergone predetermined signal processing. The scintillator layer 40 can be disposed on the pixel array 22 through a protective film 25 for protecting the pixel array 22. In addition, as the scintillator layer 40, a columnar crystal layer made of cesium iodide (CsI) doped with, for example, thallium (Tl) can be suitably used.

The first scintillator protective layer 41 is a protective layer for preventing deterioration (for example, deliquescence due to humidity) of the scintillator layer 40 due to an external environment. Referring to FIGS. 1A to 1C, the first scintillator protective layer 41 covers the overall substrate 15 and scintillator layer 40. However, this embodiment is not limited to this shape. For example, the bottom surface of the substrate 15 need not be covered with the layer. It is preferable to use, for the first scintillator protective layer 41, for example, an organic sealing material such as silicone resin, acrylic resin, or epoxy resin or a hot-melt resin such as polyester resin, polyolefin resin, or polyamide resin, specifically a resin with low moisture permeability. It is possible to use, as the first scintillator protective layer 41, for example, an organic film such as a poly-para-xylene (parylene) or polyuria film formed by a CVD method or an organic film made of a fluorine-/chloride-based resin or the like which is formed from a liquid material through coating and drying processes.

In this case, g represents the distance between the pixel array 22 of the first sensor unit $20_1$ and the pixel array 22 of the second sensor unit $20_2$, p represents the pitch of the pixels 21 in each pixel array 22, and L represents the distance from the center of a pixel $21_1$ to the center of a pixel $21_2$. The pixel $21_1$ is one of the pixels, of the pixel array 22 of the first sensor unit $20_1$, which are located closest to the second sensor unit $20_2$. The pixel $21_2$ is a pixel, of the pixel array 22 of the second sensor unit $20_2$, which is located closest to the pixel $21_2$.

The first scintillator protective layer 41 enhances the function of damp-proofing the scintillator layer 40 as a thickness t1 of the protective layer increases. However, as the thickness t1 increases, the distance g increases. That is, as the interval between the two pixels 21 on the two sides of the boundary region K (for example, the distance between the pixel $21_1$ and the pixel $21_2$), radiation information corresponding to one pixel column in the boundary region K is lost if, for example, L>2p. The radiation detection apparatus 11 may be configured to establish the relation of $t1 \leq \frac{1}{2} \times g$ and $L \leq \frac{3}{2} \times p$. This can reduce the loss of radiation information in the boundary region to at least ½ or less. If, for example, the pitch p of the pixels 21 is 50 µm, it is preferable to set, for example, the thickness t1 of the first scintillator protective layer 41 to 20 µm or less, more preferably 5 µm or less, and the distance g to 10 µm or less. This can improve the reflection efficiency of the reflection layer 50 and improve the image sharpness.

Figure 3:
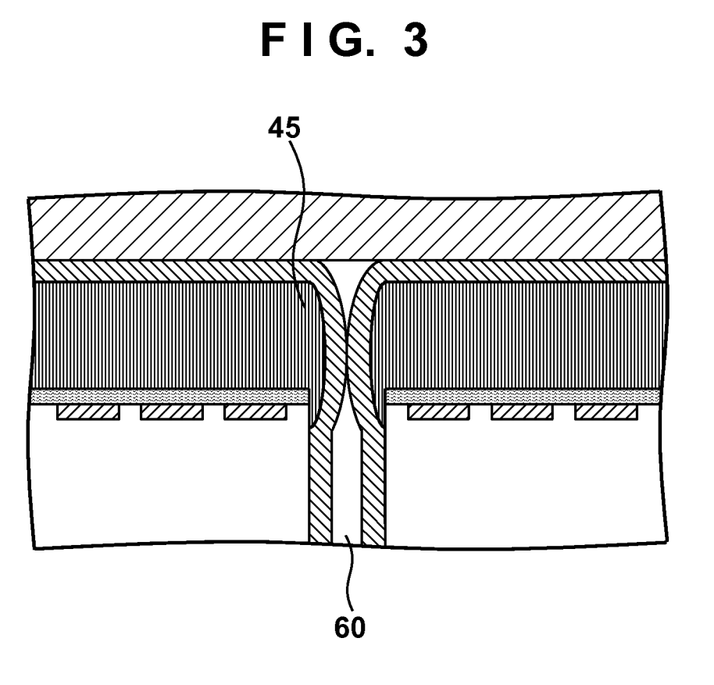
FIG. 3 is an enlarged view for explaining a comparative example.

In addition, as shown in FIG. 2A, the first sensor unit $20_1$ and the second sensor unit $20_2$ are preferably arranged such that their first scintillator protective layers 41 are in contact with each other throughout their entire side surfaces. This is because this arrangement prevents the generation of a gap in the boundary portion between the adjacent sensor units 20 when arraying (tiling) the plurality of sensor units 20. For example, as shown in FIG. 3, if each scintillator member has a convex portion 45 on a side surface of the scintillator layer 40, a gap 60 is generated to undesirably increase the distance g. The adjacent sensor units 20 are therefore preferably arrayed such that their first scintillator protective layers 41 are in contact with each other throughout their entire side surfaces. On the other hand, side surfaces of the sensor units 20 which are not adjacent to each other are not limited to this shape.

The first scintillator protective layer 41 may prevent deterioration of the scintillator layer 40 during a manufacturing process for the radiation detection apparatus 11. The second scintillator protective layer 42 may prevent deterioration of the scintillator layer 40 after the manufacturing process for the radiation detection apparatus 11. Therefore, according to the above relational expressions, the first and second scintillator protective layers 41 and 42 may be provided such that the thickness t1 of the first scintillator protective layer 41 becomes smaller than that of the second scintillator protective layer 42. Although FIG. 1A shows the second scintillator protective layer 42 covering the overall base 35 and sensor units 20, this embodiment is not limited to this shape. For example, in the radiation detection apparatus 11, the second scintillator protective layer 42 may be provided to cover the sensor units 20 of the base 35 and the sensor units 20. In other words, the second scintillator protective layer 42 can be provided to cover at least the boundaries between the adhesion layer 32 and the sensor units 20, the adhesion layer 32, the boundary between the adhesion layer 32 and the base 35, the first scintillator protective layer 41, and the boundary between the first scintillator protective layer 41 and the reflection layer 50. The same material as that for the first scintillator protective layer 41 can be used for the second scintillator protective layer 42. If, for example, poly-para-xylene or a fluorine/chloride resin is used for second scintillator protective layer 42, the thickness of the second scintillator protective layer 42 is 50 µm or more, more preferably 100 µm or more.

As exemplified in FIGS. 1A and 1B, it is preferable to integrally form the reflection layer 50 on the entire upper surfaces of the plurality of sensor units 20. Integrally forming the reflection layer 50 will effectively prevent specific reflection of light which can occur in the boundary region K, leakage of light to the outside, and incidence of light onto the adjacent sensor units 20, thereby preventing a reduction in resolution in the boundary region K. It is possible to use, for example, a metal such as aluminum (Al) or silver (Ag) can be used for the reflection layer 50.

Figure 4A:
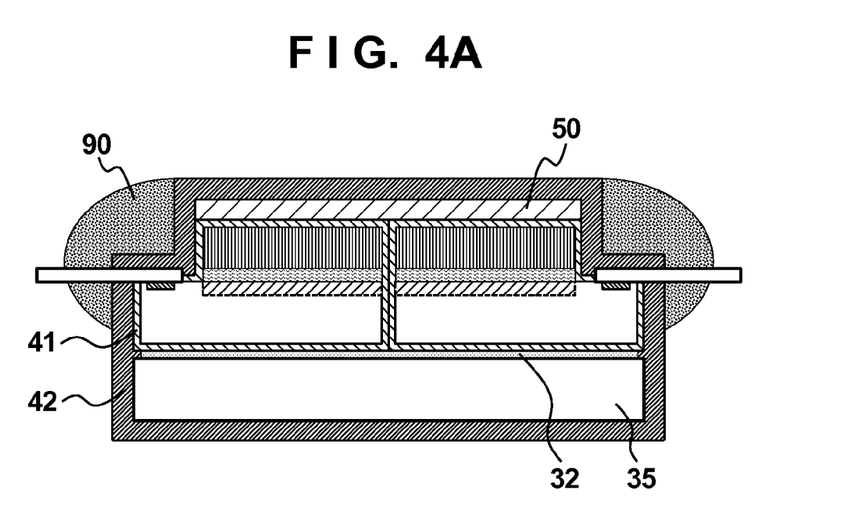
FIGS. 4A and 4B are views for explaining another example of the arrangement of the first embodiment.

In addition, as exemplified in FIG. 4A, a sealing resin 90 may be provided on a side surface portion of the radiation detection apparatus 11 to further improve the damp-proofing effect. For example, epoxy resin, acrylic resin, or the like can be used for the sealing resin 90.

An example of a method of manufacturing the radiation detection apparatus 11 will be described below with reference to FIGS. 5A to 5G. First of all, as exemplified in FIG. 5A, a substrate 15A on which a pixel array is formed is prepared, and the protective film 25 is formed as needed (a preparation process). As exemplified in FIG. 5B, the scintillator layer 40 is formed on the substrate 15A to obtain a substrate 15B (a process of forming the scintillator layer 40). The scintillator layer 40 is formed by, for example, a vacuum vapor deposition method, and a material having a columnar crystal structure such as CsI:Tl can be suitably used, as described above. Such a columnar crystal structure can be formed by properly setting a deposition temperature and a deposition pressure at the time of deposition.

Figure 5A:
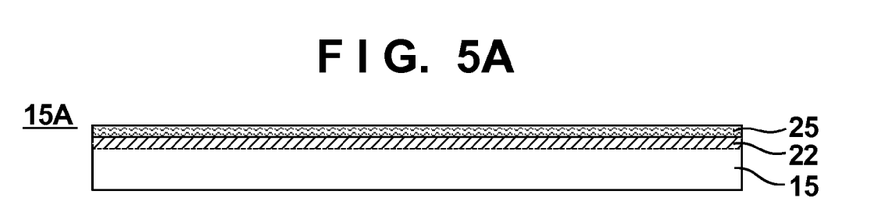
FIGS. 5A to 5G are views for explaining an example of a manufacturing method of the first embodiment.
Figure 5B:
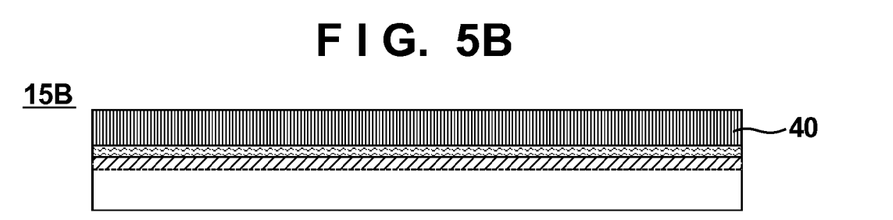
Figure 5C:
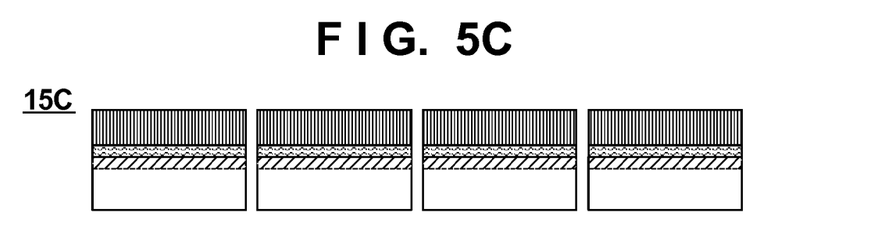

Subsequently, as exemplified in FIG. 5C, the substrate 15B is cut (or divided) to obtain a plurality of blocks (substrates 15C) (cutting process). With this cutting process, the substrates 15C are obtained so as not to form any convex portion 45 of the scintillator member on a side surface of the scintillator layer 40. In this cutting process, it is necessary to perform dry dicing to prevent deterioration of the scintillator layer 40. It is therefore preferable to perform the cutting process by dicing using a diamond saw, dry-type blade dicing, or the like. When using a silicon substrate, a cutting process may be performed by dicing using laser abrasion, stealth dicing, or the like. Alternatively, cut lines may be formed in advance on the surface of the substrate 15B on the opposite side to the surface on which the scintillator layer 40 is disposed, and the substrate is then cut by scribing so as not to form any convex portion 45.

Figure 5D:
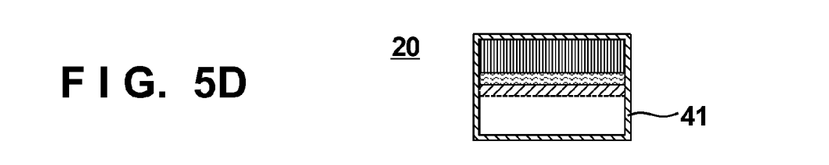

As exemplified in FIG. 5D, the first scintillator protective layers 41 are formed on the respective substrates 15C to obtain the plurality of sensor units 20 (the process of forming the sensor units 20). It is preferable to perform this process immediately after the cutting process to prevent deterioration of the scintillator layer 40 due to humidity. As described above, the first scintillator protective layer 41 can be formed by a CVD method, coating method, or the like.

Figure 5E:
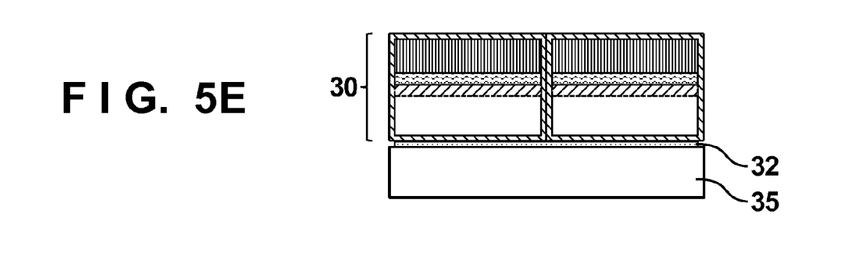

As exemplified in FIG. 5E, the respective sensor units 20 are arrayed (tiled) on the base 35 through the adhesion layer 32 to obtain the sensor panel 30 (arraying process). In this process, as described above, the respective sensor units 20 are arrayed such that the respective first scintillator protective layers 41 are in contact with each other throughout their side surfaces between the adjacent sensor units 20.

Figure 5F:
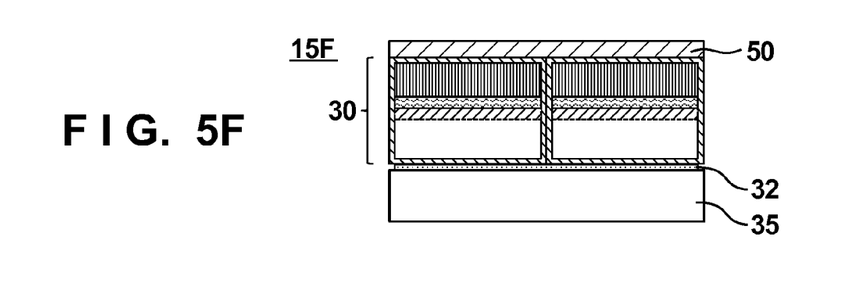

Subsequently, as exemplified in FIG. 5F, the reflection layer 50 is integrally formed on the entire upper surfaces of the plurality of sensor units 20 to obtain a substrate 15F (the process of forming the reflection layer 50). As described above, aluminum, silver, or the like can be used for the reflection layer 50. The reflection layer 50 may be formed by film formation by vacuum deposition, a sputtering method, or the like. Alternatively, a sheet-like or plate-like plate member may be disposed as the reflection layer 50.

Figure 4B:
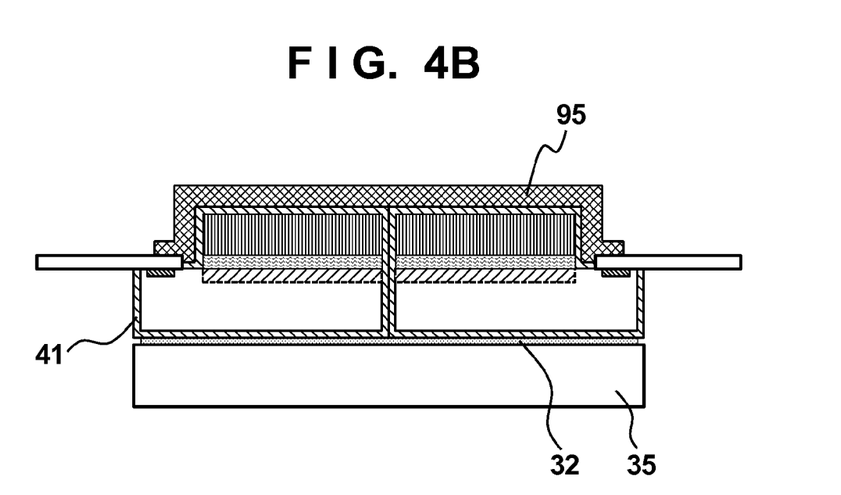
Figure 5G:
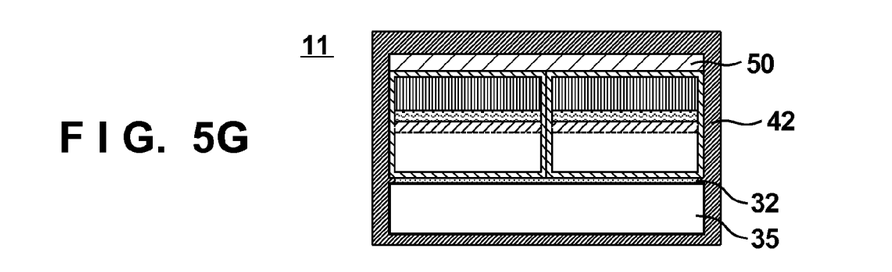

Finally, as exemplified in FIG. 5G, the second scintillator protective layer 42 is formed to cover the sensor panel 30 and the reflection layer 50 to obtain the radiation detection apparatus 11 (the process of forming the radiation detection apparatus 11). As described above, the method of forming the second scintillator protective layer 42 can use a CVD method, coating method, or the like. As exemplified in FIG. 4B, a layer (sheet 95) having the functions of both the second scintillator protective layer 42 and reflection layer 50 may be formed instead of the second scintillator protective layer 42 and the reflection layer 50.

In the above manner, the radiation detection apparatus 11 is obtained. This manufacturing method can individually form each sensor unit 20 while ensuring the damp-proofing effect for the scintillator layer 40, and can also form the radiation detection apparatus 11 with a size corresponding to a purpose/application, as needed. This embodiment is effective in increasing the pixel density of a radiation detection apparatus for a large screen in which the plurality of sensor units 20 are arrayed.

Second Embodiment

Figure 6A:
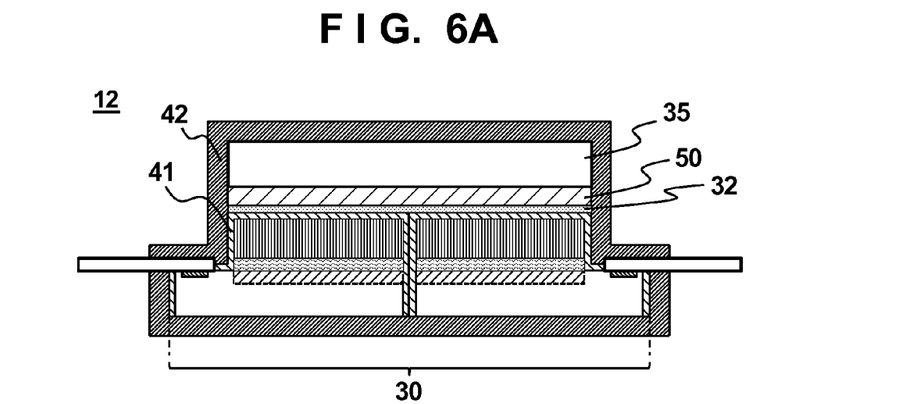
FIGS. 6A and 6B are views for explaining an example of the arrangement of the second embodiment.
Figure 6B:
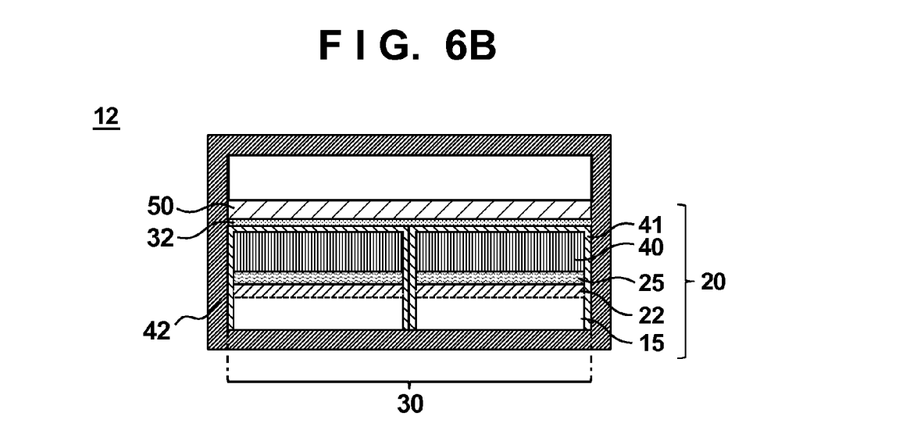

A radiation detection apparatus 12 of the second embodiment will be described with reference to FIGS. 6A and 6B, and 7A to 7G. As shown in FIGS. 6A and 6B, this embodiment differs from the first embodiment in that the radiation detection apparatus is of the back-side irradiation type. Like FIG. 1B, FIG. 6A schematically shows a sectional structure of the radiation detection apparatus 12. Like FIG. 1C, FIG. 6B schematically shows a sectional structure of the radiation detection apparatus 12. In the radiation detection apparatus 12, sensor units 20 are arrayed on a base 35, on which a reflection layer 50 is provided, through an adhesion layer 32. A material with high transmittance is used for the adhesion layer 32 to ensure the reflection efficiency of the reflection layer 50. The thickness of the adhesion layer 32 may be, for example, 25 µm or less, more preferably 10 µm or less.

In this case, since the radiation detection apparatus 12 is of the back-side irradiation type, it is preferable to decrease the thickness of a substrate 15 of sensor units 20 in accordance with the energy of radiation by polishing or the like. If, for example, the substrate 15 is a silicon substrate, glass substrate, or the like, it is preferable to set its thickness to 0.5 mm or less, more preferably 0.3 mm or less. It is possible to form the sensor units 20 by using the substrate 15 having the above thickness at an early stage in the manufacturing process or use the substrate 15 having a predetermined thickness ensured at an early stage and polish the substrate 15 to the above thickness midway in the manufacturing process. When polishing the substrate 15, there is no need to cover the surface to be irradiated with radiation with the first scintillator protective layer 41.

An example of the method of manufacturing the radiation detection apparatus 12 will be described with reference to FIGS. 7A to 7G. The processes up to the formation of the plurality of sensor units 20 may be performed in the same manner as in the first embodiment, as exemplified in FIGS. 7A to 7D. Thereafter, a sensor panel 30 is obtained by arraying (tiling) each sensor unit 20 on the base 35, on which the reflection layer 50 is provided, through the adhesion layer 32 (arraying process), as exemplified in FIG. 7E. In this case, the sensor panel 30 is formed by arraying each sensor unit 20 such that its surface located close to a scintillator layer 40, of the substrate 15 and the scintillator layer 40, is in contact with the reflection layer 50 and the base 35.

Figure 7A:
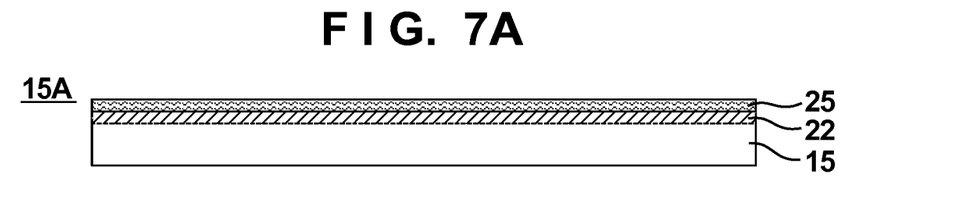
FIGS. 7A to 7G are views for explaining an example of a manufacturing method of the second embodiment.
Figure 7B:
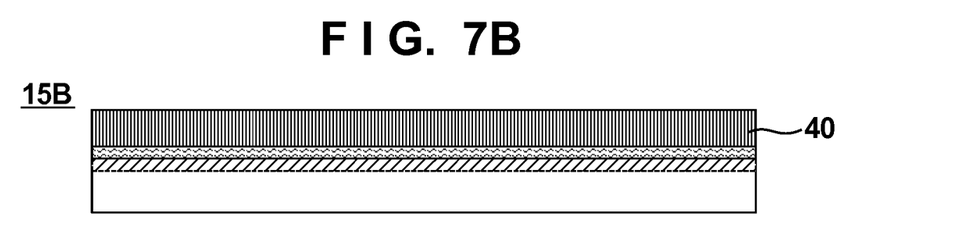
Figure 7C:
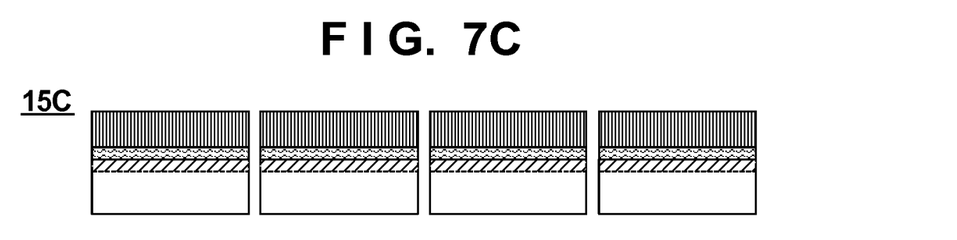
Figure 7D:
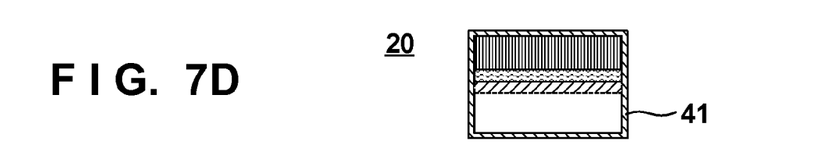
Figure 7E:
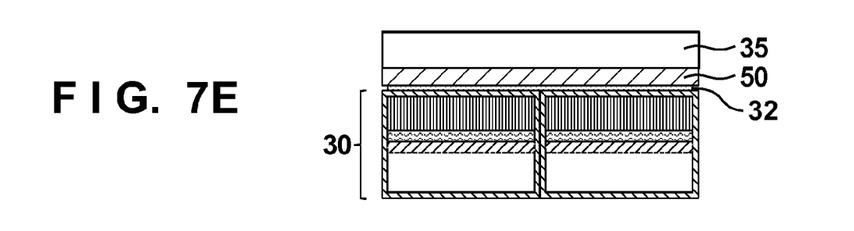
Figure 7F:
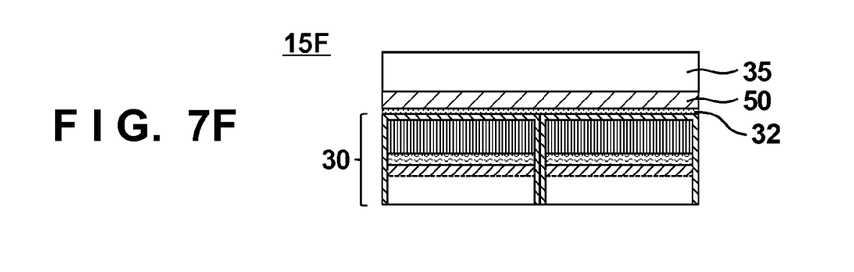

If it is necessary to decrease the thickness of the substrate 15, the substrate 15 is polished (polishing process), as exemplified in FIG. 7F. This polishing process may be performed for a surface of each sensor unit 20, which is located close to the substrate 15, of the substrate 15 and the scintillator layer 40. It is possible to remove a first scintillator protective layer 41 while polishing the substrate 15. The polishing process may be performed by dry polishing to prevent deterioration of the scintillator layer 40. This process may also be performed by wet polishing as long as it is possible to prevent deterioration. Finally, as exemplified in FIG. 7G, a second scintillator protective layer 42 is formed in the same manner as in the first embodiment to obtain the radiation detection apparatus 12 (the process of forming the radiation detection apparatus 12).

In the above manner, the radiation detection apparatus 12 is obtained. This manufacturing method can individually form each sensor unit 20 while ensuring the damp-proofing effect for the scintillator layer 40, and can also form the radiation detection apparatus 12 with a size corresponding to a purpose/application, as needed. This embodiment is effective in increasing the pixel density of a radiation detection apparatus for a large screen in which the plurality of sensor units 20 are arrayed.

Although the two embodiments have been described above, the present invention is not limited to them, the object, state, application, function, and other specifications can be changed as needed, and can be carried out by other embodiments.

Application

Figure 8:
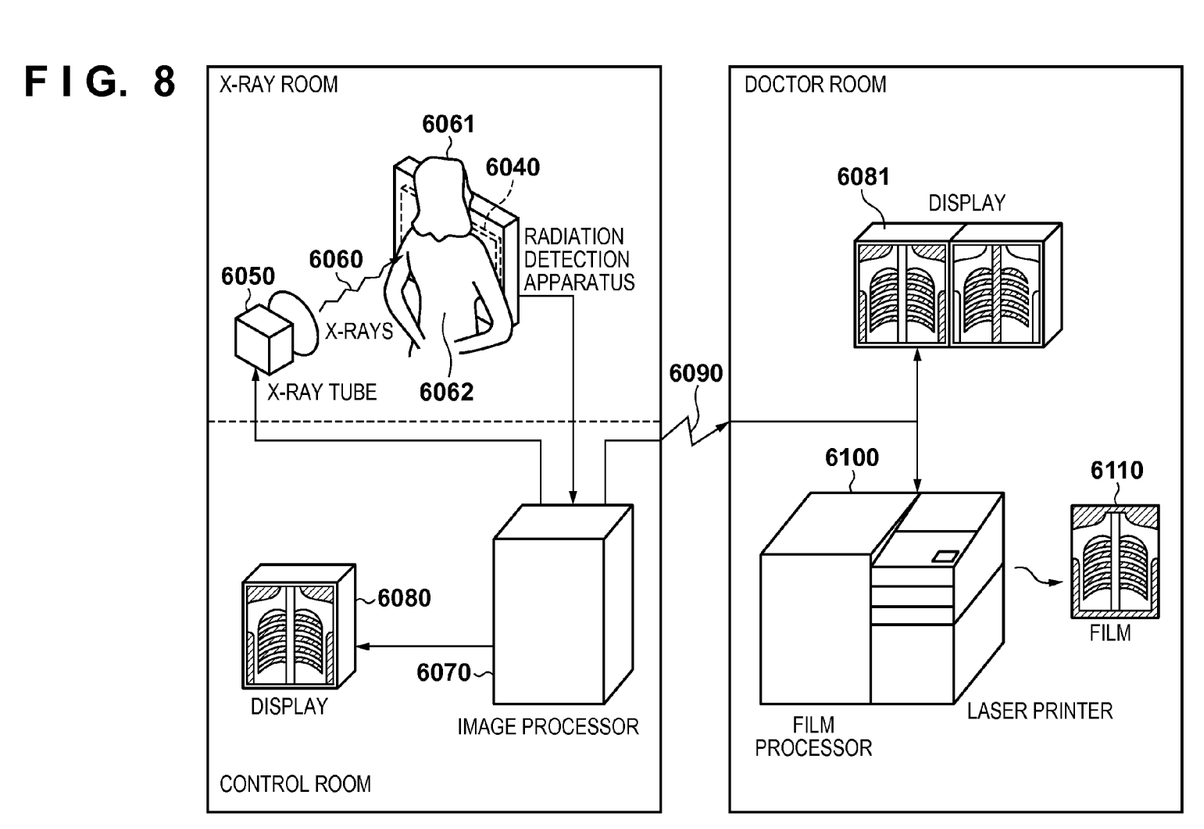
FIG. 8 is a view for explaining an example of application to a system.

The radiation detection apparatus according to each embodiment described above can be applied to an imaging system. The imaging system includes, for example, the radiation detection apparatus, a signal processing unit including an image processor, a display unit including a display, and a radiation source for generating radiation. For example, as shown in FIG. 8, X-rays 6060 generated by an X-ray tube 6050 are transmitted through a chest region 6062 of a subject 6061 such as a patient and enter a radiation detection apparatus 6040. The incident X-rays include information concerning the in-vivo information of the patient 6061. The scintillator emits light in accordance with the incident X-rays. The sensor panel detects this light to obtain electrical information. Thereafter, this information is digitally converted. An image processor 6070 (signal processing unit) performs image processing for the information. A display 6080 (display unit) in a control room can display the resultant image. A transmission processing means including a network 6090 such as a LAN or the Internet can also transfer this information to a remote place. This makes it possible to display the information on a display 6081 in a doctor room or the like in another place and allow a doctor in remote place to make diagnosis. In addition, the information can be stored in, for example, an optical disk. Alternatively, a film processor 6100 can record the information on a recording medium such as a film 6210.

Figure 9:
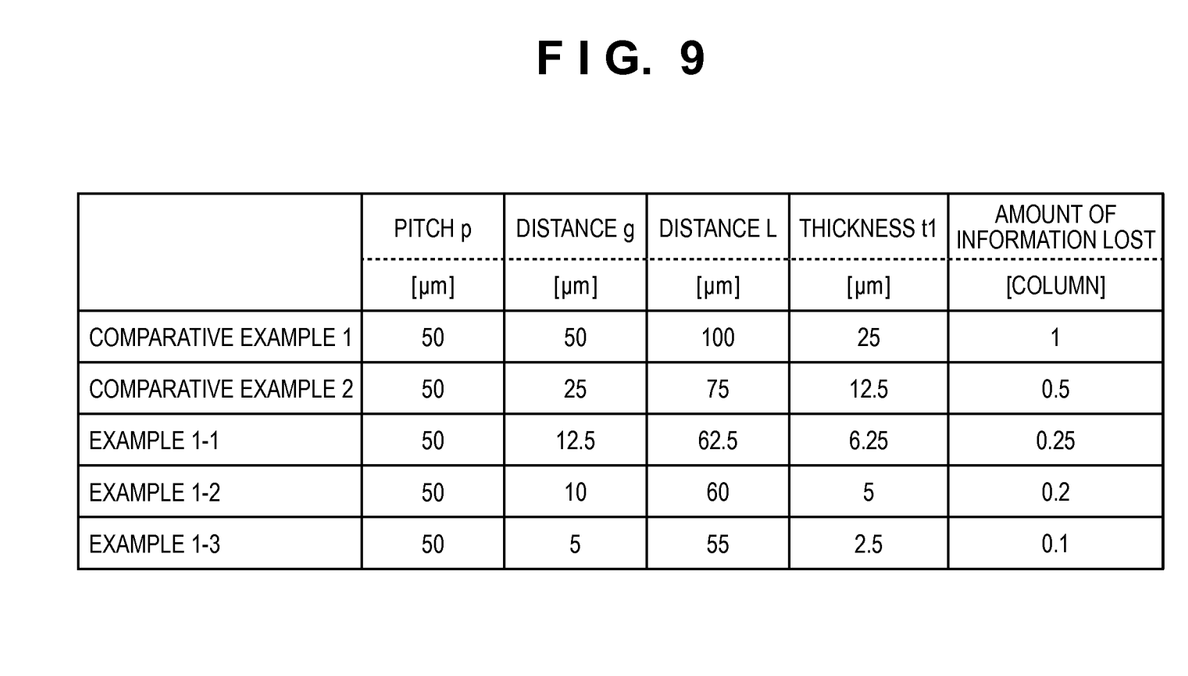
FIG. 9 is a view for explaining the results obtained by the embodiments and the comparative examples.

The results obtained by the embodiments and the comparative examples according to the respective embodiments with respect to the relationship between a thickness t1 and a distance g will be mainly described with reference to FIG. 9.

Comparative Example 1

A radiation detection apparatus for Comparative Example 1 was formed in accordance with a procedure (see FIGS. 5A to 5G) in the first embodiment. The pitch p of pixels was set to 50 µm. Silicon oxide (SiNx) was formed on a sensor array, and the protective film 25 (thickness: 7 µm) was formed on the resultant structure. The protective film 25 was formed by coating polyimide resin by a spin coating method and then curing the resin by heat. As for the scintillator layer 40, the scintillator layer 40 (thickness: 200 µm) made of CsI:Tl was formed by a vacuum deposition method. The first scintillator protective layer 41 was formed such that the thickness t1 became 25 µm. In the process of forming the first scintillator protective layer 41 (the process of forming the sensor units 20), the layer was formed by a vacuum deposition method using poly-para-xylene (parylene) while a mask process was performed so as not to form the first scintillator protective layer 41 on the signal input/output unit 70. After an arraying process, the gaps 60 were filled with an ultraviolet curing epoxy resin, and the resin was cured by irradiating it with ultraviolet light (UV). This process can planarize the upper surface of the first scintillator protective layer 41. The aluminum (Al) reflection layer 50 (thickness: 200 nm) was formed on the first scintillator protective layer 41 by a deposition method. Poly-para-xylene (parylene) was used for the second scintillator protective layer 42 like the first scintillator protective layer 41. The second scintillator protective layer 42 (thickness: 50 µm) was formed by a deposition method. Likewise in this case, a mask process was performed so as not to form the first scintillator protective layer 41 on the signal input/output unit 70, and the second scintillator protective layer 42 was formed. In the finally obtained radiation detection apparatus, the distance g was 50 µm, and the distance L was 100 µm. The pitch p of pixels was 50 µm, and the boundary region between the adjacent sensor units 20 includes a portion where no pixels can be arranged. In this case, therefore, image information corresponding to one pixel column (50 µm) is lost.

Comparative Example 2

Comparative Example 2 is the same as Comparative Example 1 except that the thickness t1 of the first scintillator protective layer 41 was set to 12.5 µm. In the radiation detection apparatus obtained in this manner, the distance g was 25 µm, and the distance L was 75 µm. In this case, the pitch p of pixels was 50 µm. For this reason, in the boundary region between the adjacent sensor units 20, image information corresponding to ½ of one pixel column is lost.

Example 1-1

Example 1-1 is the same as Comparative Example 1 except that the thickness t1 of a first scintillator protective layer 41 was 6.25 µm. In the radiation detection apparatus obtained in this manner, a distance g was 12.5 µm, and a distance L was 62.5 µm. In this case, a pitch p of pixels was 50 µm. For this reason, image information lost in the boundary region between the adjacent sensor units 20 was suppressed to ¼ of one pixel column, and the apparatus was free from any pixel abnormality or defect such as image irregularity or output variation. In addition, as a result of a humidity tolerance test (temperature: 50° C., and humidity: 90% RH), the radiation detection apparatus obtained in this manner was free from reductions in the amount of light emitted and sharpness of the scintillator layer 40 even after the lapse of 10 days.

Example 1-2

Example 1-2 is the same as Example 1-1 except that a thickness t1 of a first scintillator protective layer 41 was 5 µm. In the radiation detection apparatus obtained in this manner, a distance g was 10 µm, and a distance L was 60 µm. In this case, a pitch p of pixels was 50 µm. This obtained a highly reliable radiation detection apparatus in which image information lost in the boundary region between adjacent sensor units 20 was suppressed to ⅕ of one pixel column and which had the same humidity tolerance as that of Example 1-1.

Example 1-3

Example 1-3 is the same as Example 1-1 except that a thickness t1 of a first scintillator protective layer 41 was 2.5 µm. In the radiation detection apparatus obtained in this manner, a distance g was 5 µm, and a distance L was 55 µm. In this case, a pitch p of pixels was 50 µm. This obtained a highly reliable radiation detection apparatus in which image information lost in the boundary region between adjacent sensor units 20 was suppressed to 1/10 of one pixel column and which had the same humidity tolerance as that of Example 1-1.

The following shows the results obtained by other examples and a comparative example.

Comparative Example 3

In Comparative Example 3, a humidity tolerance test (temperature: 50° C., and humidity: 90% RH) was conducted on a radiation detection apparatus without the second scintillator protective layer 42. According to the MTF (Modulation Transfer Function) after three days of the test, the value of 2LP/mm (LinePair/mm) was reduced by about 30%, and the amount of light emitted was reduced by about 10%.

Example 2

Example 2 shows the result obtained when a sealing resin 90 was provided in the radiation detection apparatus described in Example 1-1 after the formation of a second scintillator protective layer 42, as exemplified in FIG. 4A. The sealing resin 90 was formed by coating a thermosetting adhesive (AE-901T-DA available from Ajinomoto Fine-Techno) and setting it (at 60° C. for 30 min). As in Example 1-1, this method obtained a highly reliable radiation detection apparatus in which image information lost in the boundary region between adjacent sensor units 20 was suppressed to ¼ of one pixel column and which had humidity tolerance.

Example 3

Example 3 shows the result obtained when the radiation detection apparatus described in Example 1-1 is provided with a sheet 95 having both the functions of a reflection layer 50 and second scintillator protective layer 42 instead of them, as exemplified in FIG. 4B. As the sheet 95, a PET sheet to which an Al foil having a thickness of 20 μm was bonded was used. The sheet 95 was bonded through an adhesive layer (not shown) having a thickness of 10 μm. In addition to the effects of Example 1-1, this method could omit the process of forming the second scintillator protective layer 42 and hence could reduce the cost.

Example 4

Figure 7G:
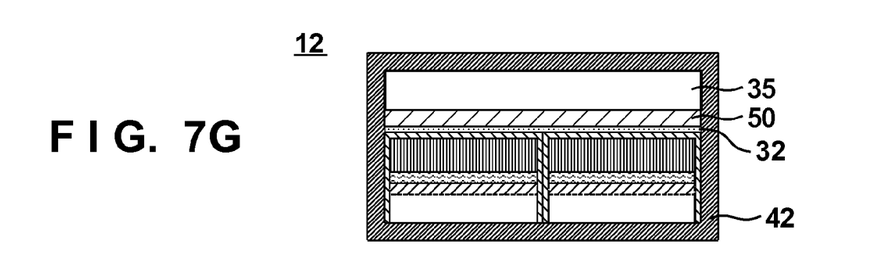

In Example 4, a radiation detection apparatus was formed following the procedure in the second embodiment (see FIGS. 7A to 7G). This procedure is the same as that in Example 1-1 up to the process of forming each sensor unit 20 (see FIGS. 7A to 7D). The sensor units 20 were bonded onto a base 35, on which a reflection layer 50 was formed, through an adhesion layer 32 (an acrylic adhesive sheet with a thickness of 10 μm) (FIG. 7E). Thereafter, a substrate 15 (silicon substrate) of each sensor unit 20 was polished. Residues after polishing were removed by air blowing (FIG. 7F). This polishing process was performed by dry polishing to obtain the substrate 15 having a thickness of 0.2 mm. Lastly, a second scintillator protective layer 42 was formed to obtain a radiation detection apparatus (FIG. 7G). This radiation detection apparatus is of the back-side irradiation type. This made it possible to obtain the effect of improving image sharpness owing to radiation entering from the back side, in addition to the effects described in Examples 1 to 3.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-139161, filed Jun. 20, 2012, which is hereby incorporated by reference herein in its entirety.

What is claimed is:

1. A radiation detection apparatus comprising:
a sensor panel in which a plurality of sensor units which detect radiation are arrayed,
wherein each of the plurality of sensor units includes
a substrate including a pixel array in which a plurality of pixels which detect light are two-dimensionally arranged,
a scintillator layer, which converts radiation into light, provided on the pixel array of the substrate, and
a first scintillator protective layer disposed to cover the scintillator layer, wherein the scintillator layer is surrounded by both the substrate and the first scintillator protective layer, the first scintillator protective layer being one of a plurality of first scintillator protective layers corresponding to the plurality of sensor units; and
a second scintillator protective layer disposed to cover the plurality of first scintillator protective layers of the plurality of sensor units, the second scintillator protective layer, on or above the plurality of first scintillator protective layers, extending over the plurality of first scintillator protective layers and across a boundary between one first scintillator protective layer and its neighboring first scintillator protective layer.

2. The apparatus according to claim 1, wherein the plurality of sensor units include a first sensor unit and a second sensor unit which are adjacent to each other, and
letting p be a pitch of the pixels in the pixel array, t1 be a thickness of the first scintillator protective layer, g be a distance between the pixel array of the first sensor unit and the pixel array of the second sensor unit, and L be a distance from a center of the pixel, in the pixel array of the first sensor unit, which is disposed at a position closest to the second sensor unit, to a center of the pixel, in the pixel array of the second sensor unit, which is disposed at a position closest to the pixel, $t1 \le \frac{1}{2} \times g$ and $L \le \frac{3}{2} \times p$.

3. The apparatus according to claim 1, wherein the first scintillator protective layer of each of the plurality of sensor units has a thickness smaller than that of the second scintillator protective layer.

4. The apparatus according to claim 1, wherein
the plurality of sensor units include a first sensor unit and a second sensor unit which are adjacent to each other, and
the first sensor unit and the second sensor unit are disposed such that the first scintillator protective layer of the first sensor unit and the first scintillator protective layer of the second sensor unit are in contact with each other throughout side surfaces thereof, without the second scintillator protective layer being sandwiched between the side surfaces,
the scintillator layer being one of a plurality of scintillator layers corresponding to the plurality of sensor units,
each of the plurality of first scintillator protective layers protecting the corresponding scintillator layer to prevent its deterioration during a manufacturing process for the radiation detection apparatus, and
the second scintillator protective layer protecting the plurality of scintillator layers to prevent their deterioration after the manufacturing process for the radiation detection apparatus.

5. The apparatus according to claim 1, further comprising a reflection layer disposed between the sensor panel and the second scintillator protective layer, the reflection layer being integrally formed on entire upper surfaces of the plurality of sensor units.

6. The apparatus according to claim 5, further comprising a base which supports the plurality of sensor units and an adhesion layer which fixes the plurality of sensor units to the base,
wherein the second scintillator protective layer is disposed to cover at least a boundary between the adhesion layer and the sensor unit, the adhesion layer, a boundary between the adhesion layer and the base, the plurality of first scintillator protective of the plurality of sensor units, and a boundary between the reflection layer and the plurality of first scintillator protective layers of the plurality of sensor units.

7. An imaging system comprising:
a radiation detection apparatus a signal processing unit which processes a signal from the radiation detection apparatus;

a display unit which displays a signal from the signal processing unit; and
a radiation source which generates the radiation,
wherein the radiation detection apparatus comprises:
a sensor panel in which a plurality of sensor units which detect radiation are arrayed,
wherein each of the plurality of sensor units includes
a substrate including a pixel array in which a plurality of pixels which detect light are two-dimensionally arranged,
a scintillator layer, which converts radiation into light, provided on the pixel array of the substrate, and
a first scintillator protective layer disposed to cover the scintillator layer, wherein the scintillator layer is surrounded by both the substrate and the first scintillator protective layer, the first scintillator protective layer being one of a plurality of first scintillator protective layers corresponding to the plurality of sensor units; and
a second scintillator protective layer disposed to cover the plurality of first scintillator protective layers of the plurality of sensor units, the second scintillator protective layer, on or above the plurality of first scintillator protective layers, extending over the plurality of first scintillator protective layers and across a boundary between one first scintillator protective layer and its neighboring first scintillator protective layer.

8. The apparatus according to claim 1, further comprising:
a reflection layer which is disposed on the sensor panel and integrally formed on entire upper surfaces of the plurality of sensor units; and
a base disposed on the reflection layer,
wherein the second scintillator protective layer covers the plurality of first scintillator protective layers of the plurality of sensor units, the reflection layer and the base.

9. The apparatus according to claim 8, wherein, for each of the plurality of sensor units, a bottom face of the base is not covered with the first scintillator protective layer and is covered with the second scintillator protective layer.

10. A radiation detection apparatus comprising:
a plurality of substrates, each including a pixel array in which a plurality of pixels which detect light are two-dimensionally arranged;
a plurality of scintillator layers, which convert radiation into light, provided on the plurality of substrates, respectively;
a plurality of first scintillator protective layers disposed to cover the plurality of scintillator layers, respectively, wherein each of the plurality of scintillator layers is surrounded by the corresponding substrate and the corresponding first scintillator protective layer, and wherein each of the plurality of first scintillator protective layers protects the corresponding scintillator layer to prevent its deterioration during a manufacturing process for the radiation detection apparatus; and
a second scintillator protective layer disposed to cover the plurality of first scintillator protective layers, wherein the second scintillator protective layer, on or above the plurality of first scintillator protective layers, extends over the plurality of first scintillator protective layers and across a boundary between one first scintillator protective layer and its neighboring first scintillator protective layer, and wherein the second scintillator protective layer protects the plurality of scintillator layers to prevent their deterioration after the manufacturing process for the radiation detection apparatus.

11. The apparatus according to claim 1, wherein, for each of the plurality of sensor units, the first scintillator protective layer covers an upper face and side faces of the scintillator layer and extends to side faces of the substrate.

12. The apparatus according to claim 11, wherein, for each of the plurality of sensor units, the first scintillator protective layer does not cover a bottom face of the substrate.

13. The apparatus according to claim 12, wherein the second scintillator protective layer further covers the bottom face of the substrate.

14. The apparatus according to claim 1, wherein at least one of the plurality of first scintillator protective layers includes a portion covering a side face of the corresponding scintillator layer, the portion being not located between two neighboring scintillator layers, and the portion being in contact with the second scintillator protective layer.

15. The apparatus according to claim 1, further comprising an interconnection,
wherein the substrate, of each of the plurality of sensor units, includes a signal input/output unit for being connected to an external signal processing circuit board via the interconnection,
the first scintillator protective layer is thinner than the interconnection and does not cover the interconnection, and
the second scintillator protective layer is thicker than the interconnection and covers part of the interconnection.

16. The apparatus according to claim 15, further comprising a sealing resin configured to improve a damp-proofing effect,
wherein the sealing resin covers a side face of the second scintillator protective layer during covering other part of the interconnection.

* * * * *